(12) United States Patent
Freidhof et al.

(10) Patent No.: US 11,009,552 B2
(45) Date of Patent: May 18, 2021

(54) OSCILLOSCOPE AND METHOD FOR TESTING A DEVICE UNDER TEST

(71) Applicant: Rohde & Schwarz GmbH & Co. KG, Munich (DE)

(72) Inventors: Markus Freidhof, Kirchseeon (DE); Randy White, Tigard (DE); Guido Schulze, Grafing (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 377 days.

(21) Appl. No.: 16/225,456

(22) Filed: Dec. 19, 2018

(65) Prior Publication Data

US 2020/0200821 A1   Jun. 25, 2020

(51) Int. Cl.
*G01R 31/319*   (2006.01)
*G01R 13/02*   (2006.01)
*G01R 31/28*   (2006.01)

(52) U.S. Cl.
CPC ... *G01R 31/31905* (2013.01); *G01R 13/0254* (2013.01); *G01R 31/2824* (2013.01); *G01R 31/31912* (2013.01)

(58) Field of Classification Search
CPC .......... G01R 31/31905; G01R 31/2824; G01R 31/31912; G01R 13/0254
USPC ...................... 324/750.01, 121 R; 702/66–67
See application file for complete search history.

(56) References Cited

U.S. PATENT DOCUMENTS

| | | | |
|---|---|---|---|
| 9,410,989 B2 | 8/2016 | Weller | |
| 2007/0136012 A1* | 6/2007 | Miller | G01R 31/31709 702/67 |
| 2012/0274313 A1 | 11/2012 | Holcomb et al. | |
| 2015/0134864 A1* | 5/2015 | Foster | G06F 11/349 710/106 |
| 2016/0204881 A1* | 7/2016 | Chung | G01R 31/2822 455/67.14 |
| 2017/0016953 A1* | 1/2017 | Beer | G01R 31/2837 |
| 2019/0114242 A1* | 4/2019 | Su | G06F 11/26 |

FOREIGN PATENT DOCUMENTS

CN   108828286 A   11/2018

OTHER PUBLICATIONS

U.S. Appl. No. 15/716,951, filed Sep. 27, 2017, 42 pages.

* cited by examiner

*Primary Examiner* — Melissa J Koval
*Assistant Examiner* — Rahul Maini
(74) *Attorney, Agent, or Firm* — Westman, Champlin & Koehler, P.A.

(57) ABSTRACT

A digital sampling oscilloscope (DSO) includes a housing, an analog measurement input interface arranged in a housing wall of the housing and a measurement acquisition system having a digitizer and an acquisition memory coupled to the digitizer. The measurement acquisition system is integrated into the housing and coupled to the analog measurement input interface. The DSO further includes a signal generator integrated into the housing. An operation mode control signal output interface is arranged in a housing wall of the housing. The signal generator is coupled to the operation mode control signal output interface and is configured to output an operation mode control signal to a device under test (DUT) connected to both the operation mode control signal output interface and the analog measurement input interface for controlling a test operation mode of the DUT.

19 Claims, 1 Drawing Sheet

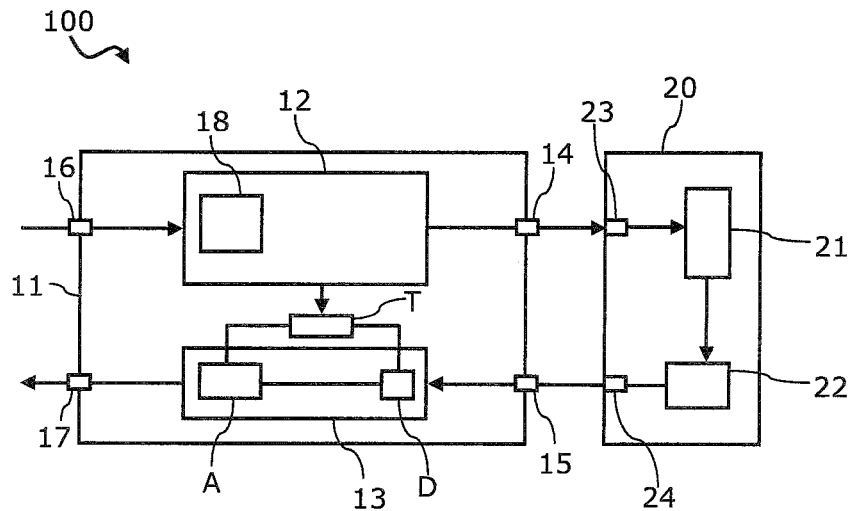
Fig. 1
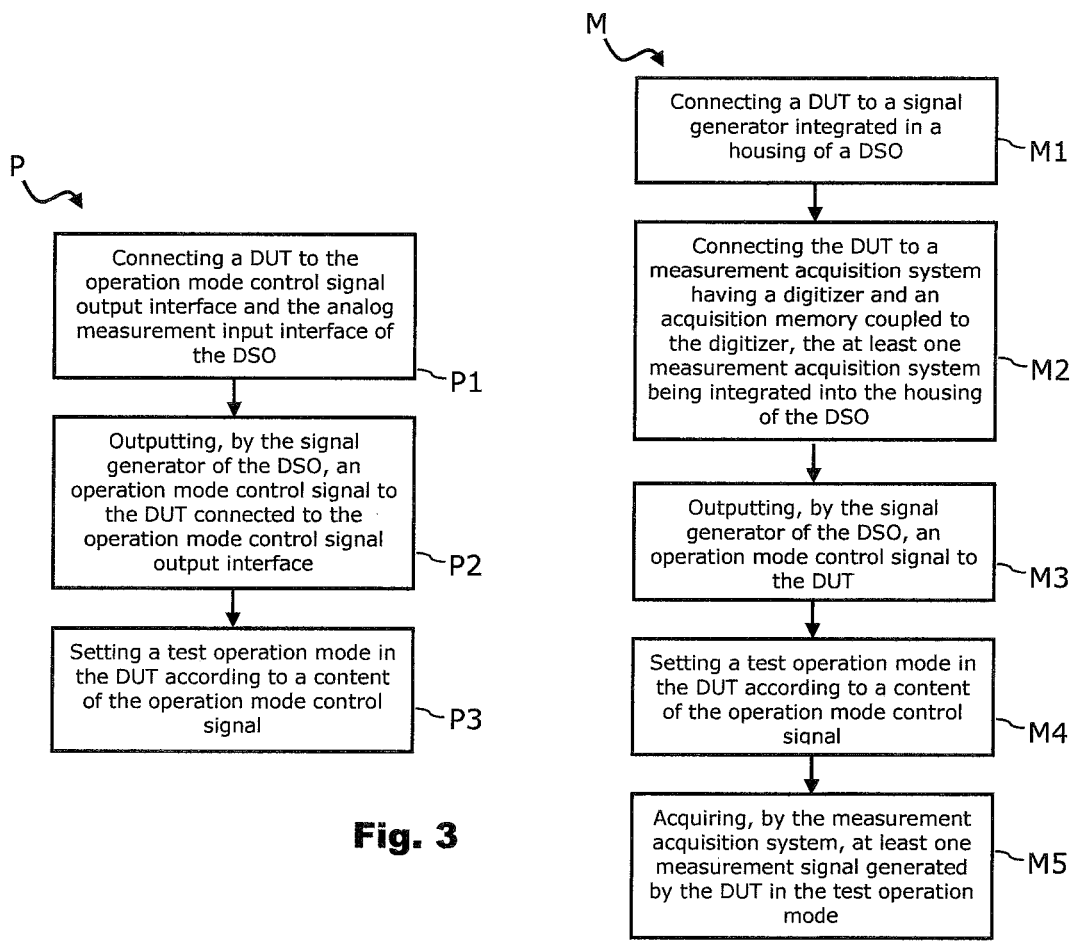
Fig. 3
Fig. 2

OSCILLOSCOPE AND METHOD FOR TESTING A DEVICE UNDER TEST

FIELD OF THE INVENTION

The present invention relates to an oscilloscope having an integrated signal generator. Moreover, the invention relates to the use of such an oscilloscope for testing a device under test and a method for testing a device under test. Such oscilloscopes and methods may be employed for testing electronic equipment, particularly mobile communication devices and mobile computing devices.

BACKGROUND OF THE INVENTION

Electronic equipment, such as a mobile communication device or a mobile computing device, is subject to various electronic tests after production. Such tests are generally necessary to ensure proper configuration, calibration and functionality of various elements of the devices under test (DUT). For testing purposes, specific testing devices are employed which simulate a testing environment under pre-defined testing conditions. For example, testing devices may employ one or more specific testing routines with predefined testing schedules. Those testing schedules regularly involve input of particular test signal sequences into the DUT and/or reception of responses to testing signals input to the DUT. Such responses may be evaluated for consistency, constancy, timeliness and other properties of an expected behaviour of the DUT.

For example, DUTs may employ serial data transmission such as under the universal serial bus protocol (USB). To that end, DUTs may have serial interfaces and corresponding data transmission modules operating according to serial data transmission standards.

Testing contemporary DUTs is currently very time-consuming: Given the high complexity of modern electronic equipment and its proliferation as mass product, testing each and every DUT suffers from potentially low throughput and high costs associated with the testing cycles, slowing down manufacturing processes and verification procedures. Thus, there is an increasing demand in solutions for testing electronic devices in a more efficient manner. In particular, solutions that improve testing speed, testing quality and testing costs of electronic equipment, particularly electronic equipment operating under serial data transmission standards, are highly sought after.

For example, document CN 108 828 286 A discloses integrated electronic test equipment.

SUMMARY OF THE INVENTION

According to the disclosure of present invention an oscilloscope, a use of such an oscilloscope in testing a device under test and a method for testing a device under test may be implemented.

Specifically, according to a first aspect of the invention, a digital sampling oscilloscope (DSO) includes a housing, an analog measurement input interface arranged in a housing wall of the housing and a measurement acquisition system having a digitizer and an acquisition memory coupled to the digitizer. The measurement acquisition system is integrated into the housing and coupled to the analog measurement input interface. The DSO further includes a signal generator integrated into the housing. An operation mode control signal output interface is arranged in a housing wall of the housing. The signal generator is coupled to the operation mode control signal output interface and is configured to output an operation mode control signal to a device under test (DUT) connected to both the operation mode control signal output interface and the analog measurement input interface for controlling a test operation mode of the DUT.

According to a second aspect of the invention, an oscilloscope according to the first aspect of the invention is used to test a device under test. Specifically, a process of testing a device under test (DUT) using the digital sampling oscilloscope (DSO) of the first aspect of the invention comprises the step of connecting a DUT to the operation mode control signal output interface and the analog measurement input interface of the DSO. The signal generator of the DSO outputs an operation mode control signal to the DUT connected to the operation mode control signal output interface. A test operation mode is set in the DUT according to a content of the operation mode control signal.

According to a third aspect of the invention, a testing method for testing a device under test involves connecting a DUT to a signal generator integrated in a housing of a digital sampling oscilloscope (DSO), connecting the DUT to a measurement acquisition system having a digitizer and an acquisition memory coupled to the digitizer, the at least one measurement acquisition system being integrated into the housing of the DSO, outputting, by the signal generator of the DSO, an operation mode control signal to the DUT, setting a test operation mode in the DUT according to a content of the operation mode control signal, and acquiring, by the measurement acquisition system, at least one measurement signal generated by the DUT in the test operation mode.

One idea of the present invention is to integrate a signal generator into an oscilloscope so that the oscilloscope used to measure test output signals from a device under test may be used to generate one or more operation mode control signals for the device under test connected to the oscilloscope.

Advantageously, testing devices under test only requires one device, i.e. the oscilloscope with the integrated signal generator, instead of two different devices. This is particularly useful the efforts to generate operation mode control signals from external sources may be reduced.

Amongst others, there are several specific advantages associated with such oscilloscopes and their concomitant methods and uses for testing devices under test. The testing equipment may be less expensive to implement since controlling functions may be integrated into the oscilloscope. The data transfer within the oscilloscope may be standardized and may be simplified. A testing system employing such an oscilloscope may be easily adapted to the testing environment due to the flexible operation of the integrated signal generator and the synchronicity of operation with the oscilloscope measurement channel.

The integrated approach for the oscilloscope further allows for very flexible adaptation on the number of DUTs and/or the number of tests to be performed. Specifically for the growing technical and functional diversification of mobile communication and computing devices, such flexibility may be put to great use when trying to efficiently and quickly meet testing demands on time.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the accompanying drawings. Elements in the drawings are illustrated for simplicity and clarity and have not necessarily been drawn to scale.

FIG. 1 schematically illustrates a testing system employing an oscilloscope according to an embodiment of the invention.

FIG. 2 shows a flowchart of procedural stages of a testing method for testing electronic equipment according to a further embodiment of the invention.

FIG. 3 shows a flowchart of procedural stages of a process for testing a device under test using an oscilloscope according to a further embodiment of the invention.

In all figures of the drawings elements, features and components which are the same or at least have the same functionality have been provided with the same reference symbols, unless explicitly stated otherwise.

DETAILED DESCRIPTION OF THE EMBODIMENTS

FIG. 1 schematically illustrates a testing system 100. The testing system 100 may be employed to perform functional tests and testing routines on one or more devices under test (DUT) which are generally denoted with reference sign 20 in FIG. 1. Specifically, the testing system 100 may be used to perform tests for mobile communication or computing devices such as laptops, notebooks, tablets, smartphones, mobile phones, pagers, PDAs, digital still cameras, digital video cameras, portable media players, gaming consoles, virtual reality glasses, mobile PCs and similar electronic equipment. Of course, it should be recognized that other non-mobile electronic equipment may be tested as well, such as—but not limited to—industrial field devices, radio communication base stations, video and TV devices, audio devices like loudspeakers and similar.

The DUT may for example include a processor 21 configured to set the DUT into various test operation modes with different testing configurations. For example, electric or electronic components—generally referred to by reference numeral 22—of the DUT may be appropriately controlled and set by the processor 21 in order to run the DUT in the desired test operation mode. The test operation mode of the DUT 20 may for example be used for testing universal serial bus communication modes of the DUT 20.

The number of DUTs 20 to be tested is in general not limited to any particular number, but will be determined by the properties and facilities of the testing equipment employed, as will be detailed hereinbelow. Generally, it is desirable to test as many DUTs 20 as possible at the same time in order to increase the efficiency of the testing routines and to keep the overall testing time for a batch of DUTs 20 as short as possible. The testing system 100 may particularly be configured and adapted to perform a testing method M as shown and explained in conjunction with FIG. 2 below.

Referring to FIG. 1, the testing system 100 comprises an oscilloscope 10 connected to one or more DUTs 20. The oscilloscope 10 may particularly be a digital sampling oscilloscope (DSO). Without loss of generality, the oscilloscope 10 will in the following description be referred to as DSO 10. The DSO 10 includes a housing 11 configured to hold all internal components of the DSO 10 in a single device. The housing 11 may be configured to shield the internal components from external electromagnetic waves. The housing 11 may further have knobs, buttons, switches and similar I/O devices configured to allow a user to control the various components of the DSO 10.

The housing 11 includes an analog measurement input interface 15 arranged in one of the housing walls of the housing. The analog measurement input interface 15 may be connected to a corresponding measurement output port 24 of a DUT 20, for example by a USB cable. The measurement output port 24 may for example be a universal serial bus I/O port. A measurement acquisition system 13 integrated into the housing 11 is coupled to the analog measurement input interface 15. The measurement acquisition system 13 may in some cases not be directly coupled to the analog measurement input interface 15. For example, an analog input processing system having an attenuator and/or an amplifier may be connected between the measurement acquisition system 13 and the analog measurement input interface 15.

The measurement acquisition system 13 includes a digitizer D and an acquisition memory A coupled to the digitizer D. The measurement acquisition system 13 is integrated into the housing 11 and may further include signal processing circuitry necessary for controlling and operating the digitizer D and the acquisition memory A. The digitizer D may be configured as an analog-to-digital converter (ADC) which samples and digitizes an input signal received at the analog measurement input interface 15. The digitizer D therefore converts input signals to be measured in the measurement acquisition system 13 into discrete digital values. The digital values are fed into the acquisition memory A which stores waveforms describing the measured electrical characteristics of the input signal as an acquisition record. All or portions of the data from the acquisition record in the acquisition memory A may be displayed as bitmapped image rendered on a display of the DSO 10. To that end, the DSO 10 may include an appropriate display system with an image processor and a display device. Furthermore, the DSO 10 may include a measurement value output interface 17 over which data from the acquisition record in the acquisition memory A may be output to externally connected measurement devices.

The DSO 10 further includes a signal generator 12 integrated into the housing 11. The signal generator 12 is coupled to an operation mode control signal output interface 14 that is arranged in one of the housing walls of the housing 11. The signal generator 12 is configured to output an operation mode control signal to the DUT 20 via the operation mode control signal output interface 14. The operation mode control signal output interface 14 may for example have an output impedance of 50Ω. The DUT 20 may have a corresponding control input port 23, for example a universal serial bus port 23, and may be connected to the operation mode control signal output interface 14 via a wired connection, such as for example a USB cable.

The signal generator 12 generates operation mode control signals for controlling a test operation mode of the DUT. For example, the operation mode control signals may be generated at a frequency of 30 MHz. The signal generator 12 may in some cases have an operation mode control signal memory 18 integrated into the signal generator 12. The operation mode control signal memory 18 may be configured to store configuration data for the signal generator 12 and may be addressed using external configuration signals received at a signal generator configuration input interface 16 arranged in the housing 11. With such external configuration signals, the signal generator 12 may be controlled to output different operation mode control signals to the DUT 20. For example, the operation mode control signal may be used for emulating at least one of distortion and predistorted communication in the DUT 20, for emulating slave/master relationships, for emulating communication with the DUT 20 or for similar purposes.

The DSO 10 may further include a trigger system T that is integrated into the housing. The trigger system T may be coupled to the measurement acquisition system 13 and/or the signal generator. The trigger system T may include an internal reference clock and corresponding trigger circuitry in order to be able to output gating and timing control signals to the digitizer and the acquisition memory. The trigger system T may for example respond to external trigger signals or to trigger signals output by the signal generator 12 upon transmission of an operation mode control signal to the DUT 20.

The functionality of the oscilloscope 10 in operation will be explained in conjunction with the testing method M as depicted in FIG. 2 and the process for testing a device under test (DUT) as depicted in FIG. 3, while resorting to the features and reference numerals of FIG. 1 for a better understanding of the underlying principles.

FIG. 2 schematically illustrates procedural stages of a testing method M for testing electronic equipment, specifically for testing a device under test (DUT) operating according to universal serial bus communication standards. The testing method M may be performed using the testing system 100 of FIG. 1. The testing method M may advantageously be used for testing DUTs such as mobile communication devices or mobile computing devices.

In the testing method M, a DUT 20 is connected to a signal generator 12 integrated in a housing of a digital sampling oscilloscope (DSO) 10 at M1. At M2, the DUT 20 is connected to a measurement acquisition system having a digitizer and an acquisition memory coupled to the digitizer, the at least one measurement acquisition system being integrated into the housing of the DSO 10. At M3, the signal generator 12 of the DSO 10 is utilized to output an operation mode control signal to the DUT 20 upon the receipt of which at the DUT 20, the DUT 20 is set to a test operation mode according to a content of the operation mode control signal at M4. Finally, at M5, the measurement acquisition system 13 of the DSO 10 is utilized to acquire at least one measurement signal generated by the DUT 20 in the test operation mode FIG. 3 schematically illustrates a process P of testing a device under test (DUT) 20 using the digital sampling oscilloscope (DSO) as shown in FIG. 1. The process P involves at P1 the procedural stage of connecting the DUT 20 to the operation mode control signal output interface 14 and the analog measurement input interface 15 of the DSO 10. The signal generator 12 of the DSO 10 outputs, at P2, an operation mode control signal to the DUT 20 connected to the operation mode control signal output interface 14. Then, at P3, a test operation mode is set in the DUT 20 according to a content of the operation mode control signal.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections between various elements as shown and described with respect to the drawings may be a type of connection suitable to transfer signals from or to the respective nodes, units or devices, for example via intermediate devices. Accordingly, unless implied or stated otherwise the connections may for example be direct connections or indirect connections.

Because the apparatus implementing the present invention is, for the most part, composed of electronic components and circuits known to those skilled in the art, details of the circuitry and its components will not be explained in any greater extent than that considered necessary as illustrated above, for the understanding and appreciation of the underlying concepts of the present invention and in order not to obfuscate or distract from the teachings of the present invention.

Also, the invention is not limited to physical devices or units implemented in non-programmable hardware, but can also be applied in programmable devices or units able to perform the desired device functions by operating in accordance with suitable program code. Furthermore, the devices may be physically distributed over a number of apparatuses, while functionally operating as a single device. Devices functionally forming separate devices may be integrated in a single physical device. Those skilled in the art will recognize that the boundaries between logic or functional blocks are merely illustrative and that alternative embodiments may merge logic or functional blocks or impose an alternate decomposition of functionality upon various logic or functional blocks.

In the description, any reference signs shall not be construed as limiting the claim. The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. The order of method steps as presented in a claim does not prejudice the order in which the steps may actually be carried, unless specifically recited in the claim.

Skilled artisans will appreciate that the illustrations of chosen elements in the drawings are only used to help to improve the understanding of the functionality and the arrangements of these elements in various embodiments of the present invention. Also, common and well understood elements that are useful or necessary in a commercially feasible embodiment are generally not depicted in the drawings in order to facilitate the understanding of the technical concept of these various embodiments of the present invention. It will further be appreciated that certain procedural stages in the described methods may be described or depicted in a particular order of occurrence while those skilled in the art will understand that such specificity with respect to sequence is not actually required.

What is claimed is:
1. A digital sampling oscilloscope (DSO) comprising:
a housing;
an analog measurement input interface arranged in a housing wall of the housing;

at least one measurement acquisition system having a digitizer and an acquisition memory coupled to the digitizer, the at least one measurement acquisition system being integrated into the housing and being coupled to the analog measurement input interface;

a signal generator integrated into the housing; and an operation mode control signal output interface arranged in the housing wall of the housing, the signal generator being coupled to the operation mode control signal output interface and being configured to output an operation mode control signal to a device under test (DUT) connected to both the operation mode control signal output interface and the analog measurement input interface for controlling a test operation mode of the DUT.

2. The DSO of claim 1, wherein the DUT is connected to the analog measurement input interface by a wired connection.

3. The DSO of claim 2, wherein the wired connection is a universal serial bus connection.

4. The DSO of claim 1, further comprising:

a trigger system integrated into the housing and coupled to the at least one measurement acquisition system, the trigger system being configured to output gating and timing control signals to the digitizer and the acquisition memory.

5. The DSO of claim 1, further comprising:

an operation mode control signal memory integrated into the signal generator, the operation mode control signal memory being configured to store configuration data for the signal generator.

6. The DSO of claim 5, further comprising:

a signal generator configuration input interface arranged in the housing and coupled to the operation mode control signal memory, the signal generator configuration input interface being configured to receive external configuration signals for configuring the operation mode control signal output by the signal generator to the DUT.

7. The DSO of claim 1, wherein the operation mode control signal is output at a frequency of 30 MHz.

8. The DSO of claim 1, wherein the operation mode control signal output interface has an output impedance of 50Ω.

9. A process of testing a device under test (DUT) using a digital sampling oscilloscope (DSO) having a housing, an analog measurement input interface arranged in a housing wall of the housing, at least one measurement acquisition system having a digitizer and an acquisition memory coupled to the digitizer, the at least one measurement acquisition system being integrated into the housing and being coupled to the analog measurement input interface, a signal generator integrated into the housing, and an operation mode control signal output interface arranged in the housing wall of the housing, the signal generator being coupled to the operation mode control signal output interface, the process comprising:

connecting the DUT to the operation mode control signal output interface and the analog measurement input interface of the DSO;

outputting, by the signal generator of the DSO, an operation mode control signal to the DUT connected to the operation mode control signal output interface; and setting a test operation mode in the DUT according to a content of the operation mode control signal.

10. The process of claim 9, further comprising acquiring measurement output signals from the DUT by the at least one measurement acquisition system.

11. The process of claim 10, wherein the acquired measurement output signals depend on the test operation mode in the DUT set by the content of the operation mode control signal.

12. The process of claim 11, wherein connecting the DUT to the operation mode control signal output interface includes forming a wired connection between the operation mode control signal output interface and a first universal serial bus port of the DUT.

13. The process of claim 12, wherein connecting the DUT to the analog measurement input interface includes forming a wired connection between the analog measurement input interface and a second universal serial bus port of the DUT.

14. The process of claim 9, wherein outputting the operation mode control signal comprises outputting the operation mode control signal at a frequency of 30 MHz.

15. A testing method for testing a device under test (DUT), the testing method comprising:

connecting a DUT to a signal generator integrated in a housing of a digital sampling oscilloscope (DSO);

connecting the DUT to a measurement acquisition system having a digitizer and an acquisition memory coupled to the digitizer, the at least one measurement acquisition system being integrated into the housing of the DSO;

outputting, by the signal generator of the DSO, an operation mode control signal to the DUT;

setting a test operation mode in the DUT according to a content of the operation mode control signal; and acquiring, by the measurement acquisition system, at least one measurement signal generated by the DUT in the test operation mode.

16. The testing method of claim 15, wherein outputting the operation mode control signal comprises outputting the operation mode control signal at a frequency of 30 MHz.

17. The testing method of claim 15, wherein the test operation mode of the DUT set according to the content of the operation mode control signal is used for testing universal serial bus communication modes of the DUT.

18. The testing method of claim 15, wherein the DUT includes a processor operable to set different test operation modes in the DUT.

19. The testing method of claim 15, wherein the operation mode control signal is used for emulating at least one of distortion and predistorted communication in the DUT.

* * * * *